United States Patent
Kokumai et al.

(10) Patent No.: US 9,247,173 B2
(45) Date of Patent: Jan. 26, 2016

(54) IMAGING APPARATUS AND IMAGING SYSTEM

(71) Applicant: CANON KABUSHIKI KAISHA, Tokyo (JP)

(72) Inventors: Kazuo Kokumai, Atsugi (JP); Yusuke Onuki, Fujisawa (JP); Hiroaki Naruse, Oita (JP); Masashi Kusukawa, Sagamihara (JP); Katsunori Hirota, Yamato (JP); Nobuyuki Endo, Fujisawa (JP); Kazuo Yamazaki, Yokohama (JP); Hiroaki Kobayashi, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/579,789

(22) Filed: Dec. 22, 2014

(65) Prior Publication Data

US 2015/0189211 A1 Jul. 2, 2015

(30) Foreign Application Priority Data

Dec. 26, 2013 (JP) ................................ 2013-269673

(51) Int. Cl.
| H04N 5/378 | (2011.01) |
| H01L 27/146 | (2006.01) |
| H04N 5/3745 | (2011.01) |

(52) U.S. Cl.
CPC .......... H04N 5/378 (2013.01); H01L 27/14612 (2013.01); H01L 27/14643 (2013.01); H04N 5/3745 (2013.01)

(58) Field of Classification Search
None
See application file for complete search history.

(56) References Cited

U.S. PATENT DOCUMENTS

| 7,990,444 | B2 * | 8/2011 | Kudoh | H01L 27/14603 257/294 |
| 8,319,166 | B2 * | 11/2012 | Kawahito | H01L 27/14609 250/208.1 |
| 8,785,993 | B2 * | 7/2014 | Abe | H01L 27/14603 257/292 |
| 9,105,539 | B2 * | 8/2015 | Miyanami | H01L 27/14623 1/1 |
| 9,117,728 | B2 * | 8/2015 | Sakano | H01L 27/14609 1/1 |
| 2002/0134918 | A1 * | 9/2002 | Miida | H04N 5/361 250/214.1 |
| 2006/0001061 | A1 * | 1/2006 | Miyatake | H04N 5/35518 257/292 |
| 2006/0261431 | A1 * | 11/2006 | Kim | H01L 27/14609 257/462 |
| 2009/0315086 | A1 * | 12/2009 | Arimoto | H01L 27/14609 257/292 |

(Continued)

FOREIGN PATENT DOCUMENTS

| JP | 2007-027711 A | 2/2007 |
| JP | 2011-054832 A | 3/2011 |

*Primary Examiner* — Michael Osinski
(74) *Attorney, Agent, or Firm* — Canon USA, Inc. IP Division

(57) ABSTRACT

Each of a plurality of pixel circuits is an insulated gate transistor and includes a first kind transistor having a maximum value of a gate potential difference to be applied equal to or higher than a first value. Each of a plurality of analog signal processing circuits is an insulated gate transistor and includes a second kind transistor having a maximum value of a gate potential difference to be applied equal to or lower than a second value that is lower than the first value. Each of a plurality of analog signal processing circuits does not include an insulated gate transistor having a maximum value of a gate potential difference to be applied not higher than the second value.

20 Claims, 4 Drawing Sheets

(56) References Cited

U.S. PATENT DOCUMENTS

| | | | |
|---|---|---|---|
| 2010/0066879 A1* | 3/2010 | Tanaka | H04N 5/335 348/300 |
| 2010/0141821 A1* | 6/2010 | Fossum | H01L 27/14609 348/308 |
| 2013/0234027 A1* | 9/2013 | Kurokawa | H01L 27/14643 250/338.4 |
| 2014/0054662 A1* | 2/2014 | Yanagita | H01L 27/14629 257/291 |
| 2014/0166860 A1* | 6/2014 | Konishi | H01L 27/14614 250/208.1 |
| 2014/0347538 A1* | 11/2014 | Toda | H04N 5/222 348/308 |
| 2015/0021461 A1* | 1/2015 | Nishihara | H01L 27/14616 250/208.1 |
| 2015/0115291 A1* | 4/2015 | Kim | H01L 31/16 257/80 |
| 2015/0124132 A1* | 5/2015 | Mabuchi | H01L 27/14609 348/296 |
| 2015/0155173 A1* | 6/2015 | Hirota | H01L 21/283 438/682 |

* cited by examiner

_US 9,247,173 B2_

IMAGING APPARATUS AND IMAGING SYSTEM

BACKGROUND OF THE INVENTION

1. Field of the Invention

One disclosed aspect of the embodiments relates to an imaging apparatus including a pixel circuit unit and a peripheral circuit unit on a single semiconductor substrate.

2. Description of the Related Art

For improved performance, in an imaging apparatus which includes a pixel circuit unit and a peripheral circuit unit on a single semiconductor substrate, providing an analog signal processing circuit or a digital signal processing unit (e.g., logic circuit) in the peripheral circuit unit has been considered.

Japanese Patent Laid-Open No. 2007-27711 discloses thicker gate insulating films of a sensor region and an analog region than a gate insulating film of a digital region.

Japanese Patent Laid-Open No. 2011-54832 discloses that the film thickness of insulating films of transistors is different between a light reception unit and a peripheral circuit unit.

For improved image quality, a pixel circuit unit needs to be driven at voltage as high as possible. On the other hand, power consumption of imaging apparatuses with increased functionality of a peripheral circuit unit therein has been a problem. According to Japanese Patent Laid-Open No. 2011-54832, a light reception unit and a peripheral circuit unit are driven at an equal voltage. It means that reduction of power consumption may not be sufficiently considered. The present disclosure provides an imaging apparatus which attempts higher image quality and lower power consumption.

SUMMARY OF THE INVENTION

An imaging apparatus having a pixel circuit unit and a peripheral circuit unit on a single semiconductor substrate includes a plurality of pixel circuits arranged, in the pixel circuit unit, in a matrix form, each of the plurality of pixel circuits including a photoelectric conversion element, a transfer element configured to transfer electric carriers generated in the photoelectric conversion element, and an amplification element configured to generate a signal based on the electric carriers generated in the photoelectric conversion element, and a plurality of analog signal processing circuits each provided, in the peripheral circuit unit, for each column of the pixel circuits, each of the plurality of analog signal processing circuits configured to process an analog signal output from the corresponding pixel circuit, and a digital signal processing unit provided in the peripheral circuit unit and configured to process a digital signal. In this case, each of the plurality of pixel circuits includes a first kind transistor being an insulated gate field effect transistor and having a maximum value of a potential difference between a potential of its gate and a potential of its body equal to or higher than a first value. Each of the plurality of analog signal processing circuits includes a second kind transistor being an insulated gate field effect transistor and having a maximum value of a potential difference between a potential of its gate and a potential of its body equal to or lower than a second value that is lower than the first value, and each of the plurality of analog signal processing circuits does not include an insulated gate field effect transistor having a maximum value of a potential difference between a potential of its gate and a potential of its body higher than the second value. The digital signal processing unit includes a third kind transistor being an insulated gate transistor and having a maximum value of a potential difference between a potential of its gate and a potential of its body equal to or lower than a third value that is lower than the second value, and the digital signal processing unit does not include an insulated gate field effect transistor having a maximum value of a potential difference between a potential of its gate and a potential of its body higher than the third value. The transfer element is the first kind transistor.

Further features of the disclosure will become apparent from the following description of exemplary embodiments with reference to the attached drawings.

DESCRIPTION OF THE EMBODIMENT

An exemplary embodiment will be described below with reference to drawings. A plurality of drawings may be referred mutually in the following descriptions and illustrations. Like numbers refer to like parts throughout a plurality of drawings. The description on common parts will be omitted properly.

Figure 1:
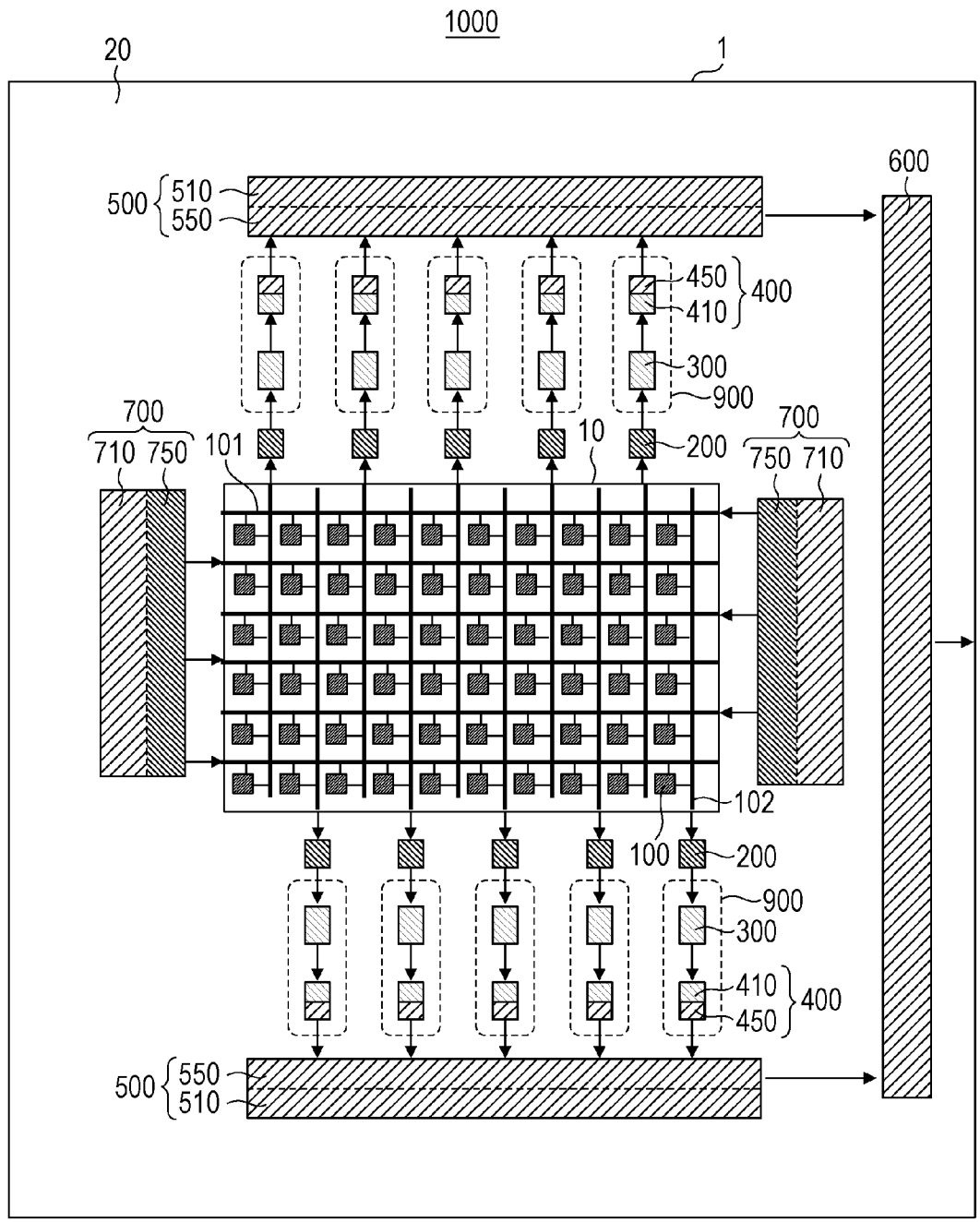
FIG. 1 is a circuit block diagram illustrating an example of an imaging apparatus.

FIG. 1 is a circuit block diagram illustrating an imaging apparatus 1000 according to an exemplary embodiment. An imaging apparatus 1000 includes a pixel circuit unit 10 and a peripheral circuit unit 20 on a single semiconductor substrate 1.

The pixel circuit unit 10 has a plurality of pixel circuits 100 arranged in a matrix form. The pixel circuits 100 of one row are commonly connected to a row wire 101, and the pixel circuits 100 of one column are commonly connected to a column wire 102.

The peripheral circuit unit 20 has a plurality of analog signal processing circuits 900 each provided for a column of the pixel circuits 100. In this embodiment, groups including a plurality of analog signal processing circuits 900 are located at upper and lower sides of the pixel circuit unit 10. However, a plurality of analog signal processing circuits 900 may be located only one of upper and lower sides of the pixel circuit unit 10. Each of the analog signal processing circuits 900 includes an amplification circuit 300 and an AD converting circuit 400 (analog-digital converting circuit). The peripheral circuit unit 20 may further include a plurality of readout circuit 200, a horizontal output circuit 500, a digital signal processing circuit 600, a vertical driving circuit 700, and a signal generating circuit. The configuration of the peripheral circuit unit 20 is not limited thereto, and some of those circuits are not required.

Each of the plurality of readout circuits 200 is provided for a column of the pixel circuits 100 and is connected to the pixel circuits 100 via the column wire 102. Each of the readout circuits 200 is connected to the analog signal processing circuit 900 corresponding to the same column of the pixel circuits 100.

Functionality and operations of the circuits will be described. A scanning unit 710 in the vertical driving circuit 700 sequentially selects an output unit 750 and drives the pixel circuits 100 column by column. The pixel circuits 100 operate based on signals from the output unit 750 in the vertical driving circuit 700, and the pixel circuits 100 generate pixel signals according to incident light. The readout circuits 200 operate so as to read out pixel signals from the pixel circuits 100. Those pixel signals are analog signals. The pixel signals read out by the readout circuits 200 are processed by the analog signal processing circuits 900. In a case where each of the analog signal processing circuits 900 has the AD converting circuit 400, output signals from the analog signal processing circuits 900 are digital signals. In a case where each of the analog signal processing circuit 900 does not have the AD converting circuit 400, output signals from the analog signal processing circuits 900 are analog signals. Each of the AD converting circuits 400 has an analog unit 410 and a digital unit 450. An analog signal is input to the analog unit 410, and the digital unit 450 outputs a digital signal.

The digital signals output from the analog signal processing circuit 900 are read out to a memory unit 550 in the horizontal output circuit 500 and is held in the memory unit 550. A scanning unit 510 in the horizontal output circuit 500 sequentially selects the memory unit 550 and outputs the signals held in the memory unit 550 column by column. Digital signals output from the horizontal output circuit 500 are signal processed by the digital signal processing circuit 600. The digital signal processing circuit 600 performs a noise reduction process or an arithmetic operation process such as an addition on the digital signals.

The imaging apparatus 1000 includes a single semiconductor substrate having the pixel circuit unit 10 and the peripheral circuit unit 20. The imaging apparatus 1000 may further include a container (package) configured to accommodate the semiconductor substrate.

The imaging apparatus 1000 may be used to construct an imaging system. The imaging system may include an optical system configured to guide light to the imaging apparatus 1000. The imaging system may include a signal processing device configured to process a signal output from the imaging apparatus 1000. The imaging system may include a display apparatus configured to display an image captured by the imaging apparatus 1000. The imaging system may typically be a camera such as a video camera and a still camera or may be an information terminal having a camera function or a surveillance camera system having an imaging apparatus and a display apparatus at separate locations.

The circuits include insulated gate field effect transistors (MOSFETs). The transistors included in the circuits may be classified into a plurality of kinds in accordance with a maximum value of a "gate potential difference" to be applied thereto. A case will be described below in which each of the circuits includes at least one of a first kind transistor, a second kind transistor, a third kind transistor, and a fourth kind transistor.

The term "gate potential difference" refers to a potential difference between a potential of a gate electrode in a certain instant and a potential of a body corresponding to the gate electrode. In a case where a source and a drain of the transistor are provided in a well, the potential of the body represents a potential of the well. The potential of the body may sometimes be called a back gate potential. In many transistors included in the circuits, a potential of a body may be equal to a potential of a source, or a potential of a body may be equal to a reference potential (ground potential). However, an embodiment is not limited thereto. Therefore, a potential difference between a potential of a gate electrode and a potential of a source, which is generally called "gate voltage" may not always be equal to the "gate potential difference" below. The magnitude relationship of the gate potential differences is evaluated based on a difference (absolute value) between a potential of a gate electrode and a potential of a body independent of their height relationship. In many transistors, a potential of a gate electrode may serve as a potential for turning on the transistor in one period, and a potential of a gate electrode may serve as a potential for turning off the transistor in another period. Thus, different potentials are applied to the gate electrode in time series manner. Therefore, the gate potential difference may differ in time series manner.

In the first kind transistor, the maximum value of a gate potential difference to be applied is equal to or higher than a first potential difference V1 (first value). In the second kind transistor, the maximum value of a gate potential difference to be applied is equal to or lower than a second potential difference V2 (second value). In the second kind transistor, the maximum value of the gate potential difference to be applied is equal to or higher than a potential difference V2'. In the third kind transistor, the maximum value of a gate potential difference to be applied is equal to or lower than a third potential difference V3 (third value). In the third kind transistor, the maximum value of the gate potential difference to be applied is equal to or higher than a potential difference V3'. In the fourth kind transistor, the maximum value of a gate potential difference to be applied is equal to or lower than a fourth potential difference V4 (fourth value). In the fourth kind transistor, the maximum value of the gate potential difference to be applied is equal to or higher than 0 V.

According to this exemplary embodiment, the second potential difference V2 is lower than the first potential difference V1. The potential difference V2' is lower than the second potential difference V2, and the third potential difference V3 is lower than the second potential difference V2 and potential difference V2'. The potential difference V3' is lower than the third potential difference V3. The fourth potential difference V4 is lower than the third potential differences V3 and V3'. In other words, a relationship of V1>V2>V2'>V3>V3'>V4 is satisfied. Other kinds of transistor than those first to fourth kind transistors may be provided. More specifically, transistors may be provided which have a maximum value of either one of gate potential differences (a) lower than the first potential difference V1 and higher than the second potential difference V2, (b) lower than the potential difference V2' and higher than the third potential difference V3, and (c) lower than the potential difference V3' and higher than the fourth potential difference V4.

According to an example of this exemplary embodiment, the maximum value of the gate potential difference of the first kind transistor may be equal to 5 V, and the maximum value of the gate potential difference of the second kind transistor may be equal to 4 V or 3 V. The maximum value of gate potential difference of the third kind transistor may be 2 V, and the maximum value of the gate potential difference of the fourth kind transistor may be equal to 1 V. The values of potential differences described above are values acquired by rounding off to the whole number, and it means, for example, that 3 V falls within a range from 2.5 to 3.4 V.

A significant difference between the first potential difference V1 and the second potential difference V2 is equal to or higher than 0.10 V. A difference between the first potential difference V1 and the second potential difference V2 is preferably equal to or higher than 0.50 V and is more preferably equal to or higher than 1.0 V. A significant difference between the third potential difference V2' and the second potential difference V3 is equal to or higher than 0.10 V. A difference between the potential difference V2' and the second potential difference V3 is preferably equal to or higher than 0.50 V and is more preferably equal to or higher than 1.0 V. A significant difference between the potential difference V3' and the potential difference V4 is equal to or higher than 0.10 V. A difference between the potential difference V3' and the potential difference V4 is preferably equal to or higher than 0.50 V and is more preferably equal to or higher than 1.0 V.

According to an example of this exemplary embodiment, the first potential difference V1 to be referred for defining the first kind transistor may be set to 4.5 V, for example, and the potential difference V3 to be referred for defining the third kind transistor may be set to 2.0 V, for example. Thus, a transistor having its maximum value of a gate potential difference in a range equal to or lower than 2.5 V (=V3+0.5) and equal to or higher than 4.0 V (=V1−0.5) may be the second kind transistor. Setting the first potential difference V1 to 4.0 V or higher and the second potential difference V2 to 4.0 V or below may be practical for achieving low power consumption and acquiring a high quality image.

Figure 2:
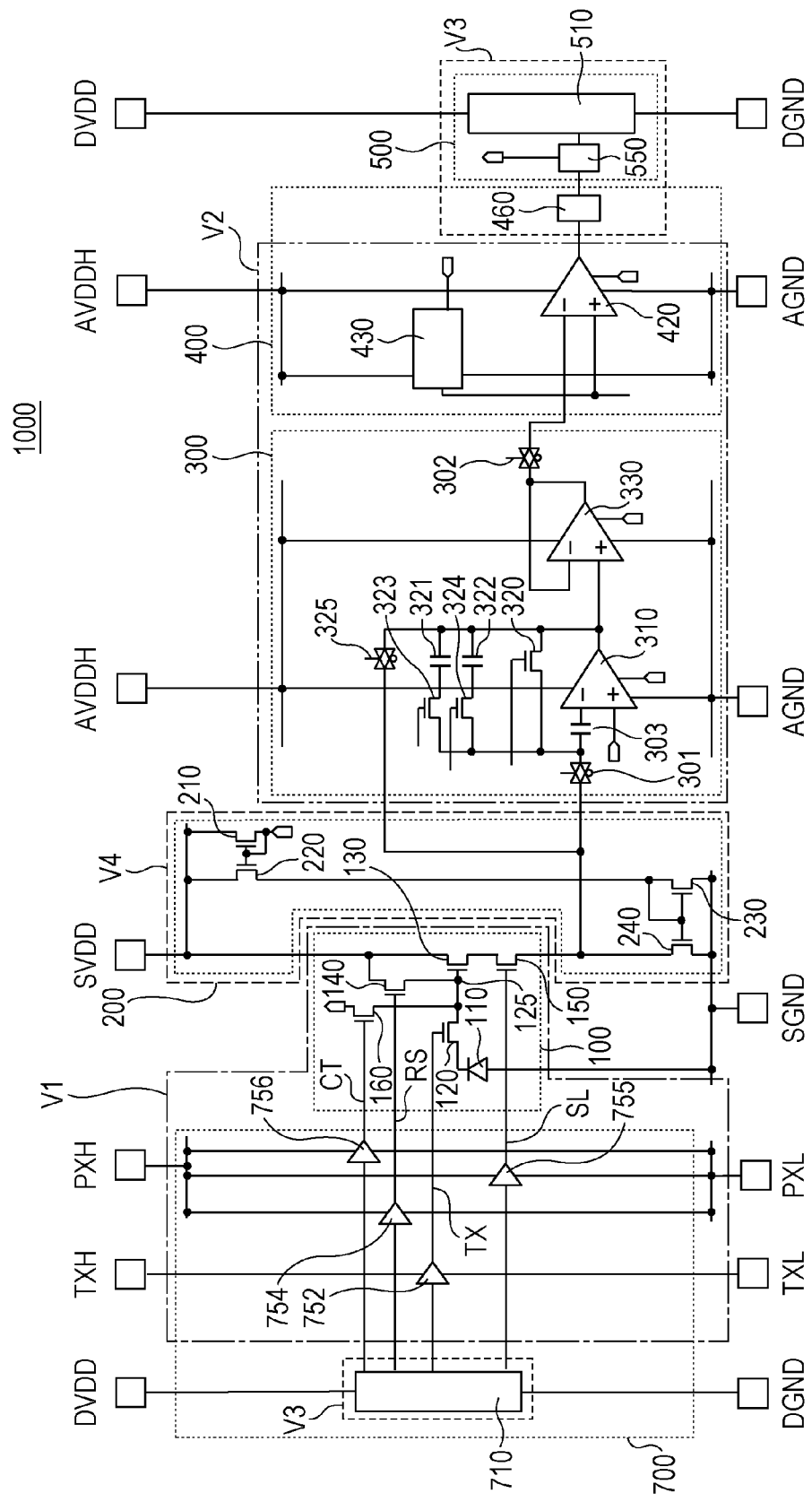
FIG. 2 is a circuit diagram illustrating an example of an imaging apparatus.

According to this exemplary embodiment, the kinds of transistor differ in accordance with the circuit included in the imaging apparatus 1000. The circuits and kinds of transistors included therein will be described in more detail with reference to FIG. 2. FIG. 2 is a circuit diagram illustrating specific configurations of the circuits. In FIG. 2, each of the circuits is surrounded by dash lines.

FIG. 2 also illustrates positions of the first to fourth kind transistors. In the example illustrated in FIG. 2, a circuit in a region surrounded by an alternate long and short dash line indicated by V1 includes at least the first kind transistor. In FIG. 2, a circuit in a region surrounded by an alternate long and two short dash line indicated by V2 includes at least the second kind transistor. In FIG. 2, a circuit in a region surrounded by a dash line indicated by V3 includes at least the third kind transistor. In FIG. 2, a circuit in a region surrounded by a long dash line indicated by V4 includes at least the fourth kind transistor.

The maximum value of gate potential differences of some transistors of circuits in a region divided by one of those lines may be different from the maximum value of gate potential differences of the other transistors. A plurality of kinds of transistor among the first to fourth kind transistors may be included in one circuit. It should be noted that a plurality of transistors may possibly have an equal maximum value of gate potential differences in different periods.

The pixel circuit unit 10 includes an N type transistor only. On the other hand, the peripheral circuit unit 20 includes a P type transistor to form a complementary circuit (CMOS circuit) together with the N type transistor. The magnitude relationship between a potential of a body and a potential of a gate is reverse between an N type transistor and a P type transistor, but the maximum values, which are absolute values, of gate potential differences may be compared.

Referring to FIG. 2, the pixel circuit 100 in the region surrounded by an alternate long and short dash line includes the first kind transistor. The fourth kind transistors are further included in a part of the output unit 750 in the vertical driving circuit 700 and in the readout circuit 200 illustrated in FIG. 1. Particularly each of in the pixel circuits 100, a transfer element 120 configured to transfer a signal charge generated in a photoelectric conversion element 110 may be the first kind transistor. The transfer element 120 to which a signal charge is transferred has a drain being a floating diffusion region that forms a part of a node 125 (floating node) connected to a gate of an amplification element 130. The amplification element 130 has a source connected to a current source of the readout circuit 200 and forms a source follower. In this embodiment, a reset element 140 configured to reset a potential of the node 125 and a selection element 150 placed at a following stage of the amplification element 130 and configured to select an ON/OFF state of an output from the pixel circuit 100 to a vertical output line are also the first kind transistors. For addition of signals in the pixel circuit in this embodiment, the node 125 is connectable to a floating node of another pixel circuit. A control element 160 configured to control an ON/OFF state of the connection between the node 125 and a floating node of another pixel circuit is also the first kind transistor. The amplification element 130 may also be the first kind transistor. The gate potential difference of the amplification element 130 changes in accordance with the potential of the node 125 based on the quantity of signal charge.

A difference between the first potential difference V1 and the second potential difference V2 may be equal to or higher than a threshold voltage VTHA of the amplification element 130. The term "threshold voltage" here refers to a gate voltage indicating a boundary condition between a case where a channel is formed between a source and a drain and a case where a channel is not formed. When a gate voltage is equal to or higher than the threshold voltage, a channel is formed. When a gate voltage is lower than the threshold voltage, a channel is not formed therebetween. The term "gate voltage" refers to an absolute value (potential difference) of a difference between a potential of a gate electrode and a potential of a source. If an N type MOS transistor is of an enhancement type, it means that a potential of a gate electrode is higher than a potential of a source with respect to the threshold voltage. On the other hand, if an N type MOS transistor is of a depression type, it means that a potential of a gate electrode is higher than a potential of a source with respect to the threshold voltage. The amplification element 130 in this embodiment may be of an enhancement type.

A threshold voltage $V_{TH}$ in an insulated-gate field effect transistor may be acquired by the following expression (1).

$$V_{TH} = \Phi_{MS} + 2\psi_B + \frac{\sqrt{2\varepsilon_S q N_A (2\psi_B + V_B)}}{C_O} \quad (1)$$

Here, $\Phi_{MS}$ [V] is a work function difference between a gate electrode of polysilicon, for example, and a body of single crystal silicon, for example. $2\psi_B$ [V] is an energy difference between a Fermi level and an intrinsic Fermi level. $C_O$ [F/cm$^2$] is a capacitance of a gate insulating film, $\varepsilon_S$ [F/cm] is a dielectric constant of a body, q [C] is an elementary charge, a $N_A$ [cm$^{-3}$] is an impurity concentration of the body. $\psi_B$ is expressed by $(kT/q)*\ln(N_A/n_i)$. k [J/K] is a Boltzmann constant, T [K] is a temperature of the body, $n_i$ [cm$^{-3}$] is an intrinsic carrier density of the body. In a silicon device normally used at a normal temperature (300K), $2\psi_B$ [V] is typically equal to 0.6 to 0.9 [V]. When an N type silicon gate electrode and a silicon substrate are used, $\Phi_{MS}+2\psi_B$ is approximately equal to −0.1 [V]. $V_B$ [V] indicates a substrate reverse bias voltage, and a substrate reverse bias is applied such that a potential of a body may be equal to $-V_B$ [V] ($V_B>0$) by setting a potential of a source as a reference potential. When such a substrate reverse bias is applied, a depletion region of the substrate is extended to increase the threshold voltage. A typical range of the threshold voltage is equal to or higher than 0.4 V and equal to or lower than 1.0 V. Assuming $V_B=0$ in Expression (1), a lower limit value of the threshold voltage $V_{TH}$ is acquired irrespective of the presence or absence of a substrate reverse bias. Accordingly, a lower limit of the threshold voltage $V_{TH}$ of the amplification element 130 is acquired from a result of $V_B=0$ in Expression (1). From this, it is understood that a difference ΔV between the first potential difference V1 and the second potential difference V2 may be required to satisfy the following expression (2) for the amplification element 130. In Expression (2), $\psi_B$ in Expression (1) is replaced by a function of a temperature T. The temperature T refers to a temperature of a body in operation but may practically be equal to a normal temperature 300 [K].

$$\Delta V \geq \Phi_{MS} + \frac{2kT}{q}\ln\left(\frac{N_A}{n_i}\right) + \frac{2}{C_O}\sqrt{\varepsilon_S N_A kT \ln\left(\frac{N_A}{n_i}\right)} \quad (2)$$

The fact that the amplification element 130 is the first kind transistor means that the potential difference V1 to be referred for defining the first kind transistor is equal to or lower than the maximum value of the gate potential difference of the amplification element 130. Thus, first potential difference V1 is determined in accordance with a dynamic range of an output of the pixel circuit 100. In view of this, the maximum value of the gate potential difference of the amplification element 130 may be set to the potential difference V1 that defines the first kind transistor. In other words, a transistor having the maximum value of the gate potential difference equal to or higher than the maximum value of the gate potential difference of the amplification element 130 may be defined as the first kind transistor.

A gate electrode of the transfer element 120 receives a transfer signal TX. A gate electrode of the reset element 140 receives a reset signal RS, a gate electrode of the selection element 150 receives a selection signal SL, and a gate electrode of the control element 160 receives a control signal CT.

Externally supplied potentials are indicated above and below circuits in FIG. 2. DVDD, SVDD, and AVDD are power supply potentials. DGND, SGND, and AGND are reference potentials (ground potentials). TXH is a maximum potential of potentials of the signal TX, and TXL is a lowest potential of the potentials of the signals TX and may be a negative potential, for example. PXH is a maximum potential among the signals RS, SL, and SW. PXL is a lowest potential among the signals RS, SL, and SW.

Referring to FIG. 2, the vertical driving circuit 700 has a buffer 752 configured to output a transfer signal TX in an output unit 750 of the vertical driving circuit 700. A buffer 754 configured to output a reset signal RS, a buffer 755 configured to output a selection signal SL, and a buffer 756 configured to output a control signal CT are further provided.

Each of the buffers 752, 754, 755, and 756 has a P type transistor and an N type transistor having their drains connected to a common output node. When the P type transistor is turned on, a potential PXH or a potential TXH given to a source of the P type transistor is output. When the N type transistor is turned on, a potential PXL or a potential TXL given to a source of the N type transistor is output. A gate potential difference of the P type transistor included in each of the buffers 752, 754, 755, and 756 may be higher than the second potential difference V2 and the P type transistor is the first kind transistor in this embodiment. A gate potential difference of the N type transistor included in the buffer 752 may be equal to or higher than the first potential difference V1 and the N type transistor is the first kind transistor in this embodiment. A gate potential difference of the N type transistor included in each of the buffers 754, 755, and 756 may be equal to or lower than the second potential difference V2, and the N type transistor is the second kind transistor in this embodiment. According to this embodiment, the maximum value of the gate potential differences of N type transistors of a plurality of transistors included in the buffers 754, 755, and 756 is lower than the maximum value of the gate potential difference of the N type transistor included in the buffer 752.

Transistors included in the readout circuits 200 positioned in a region surrounded by an alternate long and short dash line in FIG. 2 are the fourth kind transistors. For example, transistors 210, 220, 230, and 240 which form a current mirror circuit of a 5 to 10 μA, for example, current source in the readout circuit 200 are the fourth kind transistors.

Figure 3:
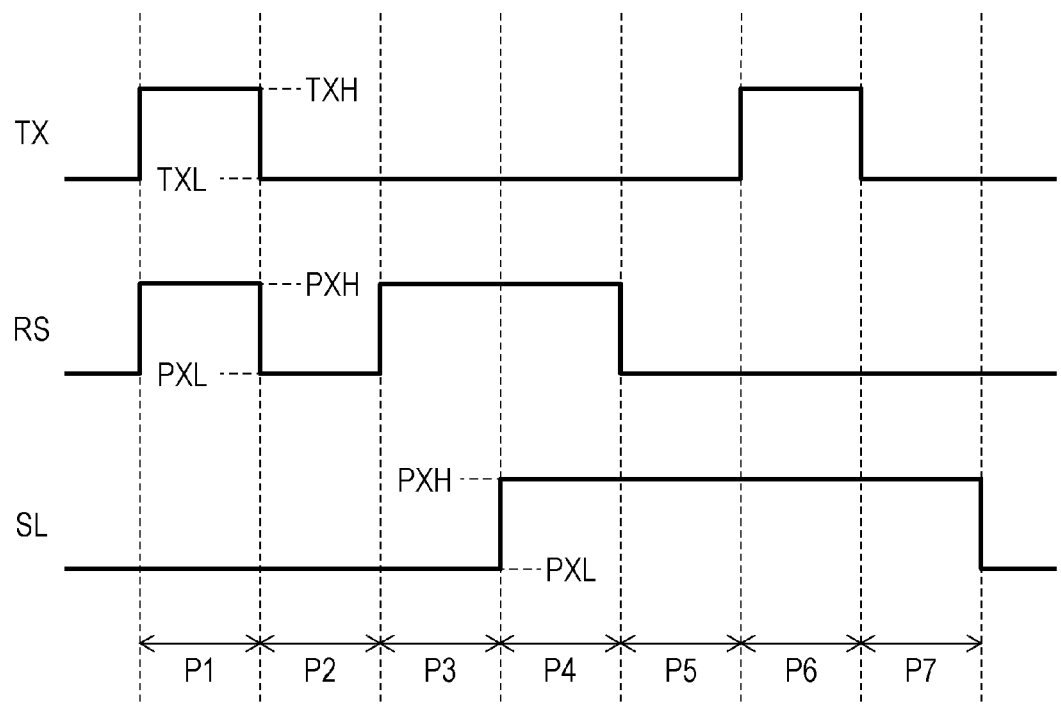
FIG. 3 is a timing chart illustrating operations of an imaging apparatus.

FIG. 3 is a timing chart of operations of the pixel circuit 100.

In a period P1, the transfer element 120 and reset element 140 are turned on. Thus, residual electrons within the photoelectric conversion element 110 are discharged through the transfer element 120 and reset element 140.

When light enters to the photoelectric conversion element 110, photoelectric conversion is performed to generate signal charges according to the quantity of light. In a period P2, transistors in the pixel circuit 100 are turned off. Thus, because electric carriers are not read out, the generated signal charges are accumulated in the photoelectric conversion element 110.

In a period P3, the reset element 140 is turned on. Thus, the potential VFD of the node 125 is reset. If the signal charges are electrons, the gate potential difference of the amplification element 130 which is an N type MOSFET decreases as the signal charges increase. Therefore, the gate potential difference of the amplification element 130 may have the maximum value in a period when the reset element 140 is turned on and the signal charges are reset. In other words, the maximum value of the gate potential difference of the amplification element 130 is determined based on an internal cause such as a power supply potential SVDD of the pixel circuit 100, instead of an external cause such as the quantity of incident light.

The potential of the gate electrode of the amplification element 130 when the gate potential difference of the amplification element 130 has the maximum value is equal to the potential of the node 125 when reset and is based on the potential SVDD. More specifically, the potential has a value in consideration of a voltage drop caused by the reset element 140 against the potential SVDD. A voltage drop caused by the reset element 140 may be represented by the threshold voltage VTHR of the reset element 140. Therefore, the maximum value of the gate potential difference of the amplification element 130 may be represented by SVDD-VTHR.

In periods P4 to P7, the selection elements 150 at rows which performs a readout operation from corresponding vertical output lines are turned on among the plurality of pixel circuits 100.

In the source follower, a relationship between an input potential VIN and an output potential VOUT is determined based on the threshold voltage VTHA of the amplification element 130 and is represented by VOUT≤VIN−VTHA. The input potential VIN is represented by VOUT≤VFD−VTHA because it corresponds to the potential VFD of the node 125. The relationship VOUT≥V2 may be satisfied for the second potential difference V2 to reduce power consumption. Therefore, V2≤VFD−VTHA is derived.

As described above, the maximum value PXL of the gate potential difference of the reset element 140 may be equal to or higher than SVDD. In this case, relationships SDVV=VFD+VTHR and VFD≥VOUT+VTHA are satisfied. Therefore, about PXL, a relationship PXL≥SDVV≥VOUT+VTHA+VTHR is satisfied. In consideration of the relationship VOUT≥V2, a relationship PXL≥V2+VTHA+VTHR is satisfied, and a relationship PXL−V2≥VTHA+VTHR is derived. In other words, a difference between the maximum value of the gate potential difference in the reset element 140 and the second potential difference V2 may be equal to or higher than a sum of the threshold voltage VTHA of the amplification element and the threshold voltage VTHR of the reset element 140.

In a period P5, the other elements excluding the selection element 150 are turned off. A signal read out from the output line in this state may be regarded as noise within the pixel circuit 100.

In a period P6, the transfer element 120 is turned on. Thus, the potential difference based on the quantity of electric carriers accumulated in the photoelectric conversion element 110 is applied to the gate of the amplification element 130. When the transfer element 120 is turned on, the gate potential difference of the transfer element 120 has a maximum value. In order to appropriately transfer electric carriers such that residual electric carriers may be reduced in the photoelectric conversion element 110, the potential of the gate of the transfer element 120 during the transfer operation may be brought higher than the potential VFD of the node 125. For example, when the power supply potential difference of the transistors in the pixel circuit 100 is 5.0 V, the gate potential difference of the amplification element 130 may be in a range of 3.0 to 4.5 V depending on the quantity of signal charges.

In a period P7, an analog pixel signal is read out from the drain of the amplification element 130 to the output line in accordance with the potential difference applied to the gate of the amplification element 130. Because the signal in this case contains noise within the pixel circuit, a CDS circuit in the analog signal processing circuit 900 in a following stage may take a difference between a noise component and a signal component to remove noise from the photoelectric-converted pixel signal.

The potential TXH and potential PXH (such as +5 V) are applied to the sources and bodies of the P type transistors of the buffers 752, 754, 755, and 756. The potentials of the gate electrodes of the P type transistors of the buffers 752, 754, 755, and 756 when the gate potential difference of the P type transistors of the buffers 752, 754, 755, and 756 have maximum values are lower potentials (such as 0 V) than the potentials of the bodies.

The maximum values of the gate potential differences of the P type transistors in the buffers 752, 754, 755, and 756 are substantially equal to that of the first kind transistors of the pixel circuit 100 so that the buffers may output the potential TXH and potential PXH. Accordingly, the P type transistors included in the buffers 752, 754, 755, and 756 are the first kind transistors, like the transistors of the pixel circuit 100.

Here, a relationship between the transistor of the buffer 752 and the transfer element 120 will be described. The transfer element 120 in this embodiment is of a depression type. In other words, when the gate potential difference of the transfer element 120 is equal to 0 V, the transfer element 120 has an ON state. It is assumed that the potential to be applied to the gate electrode of the N type transistor in the buffer 752 when the gate potential difference of the N type transistor in the buffer 752 has a maximum value is GBN (such as +3 V), for example. An equal potential (such as +3 V) to GBN is also applied to the potentials of the gate electrodes of the N type transistors in the buffers 754, 755, and 756 when the gate potential differences of the N type transistors in the buffers 754, 755, and 756 have maximum values. A potential PXL (such as 0 V) is applied to the sources and bodies of the N type transistors in the buffers 754, 755, and 756. Thus, the potential PXL is output from the buffers 754, 755, and 756. On the other hand, a lower potential TXL than the potentials PXL of the sources and bodies of the N type transistors in the buffers 754, 755, and 756 is applied to the source and body of the N type transistor in the buffer 752. Thus, the potential TXL is output from the buffer 752. As a result, a negative potential corresponding to the potential TXL is applied to the gate electrode of the transfer element 120. Because the potential TXL is applied during the electric carrier accumulation period P2 in the photoelectric conversion element 110, the gate of the transfer element 120 during the accumulation period P2 may be strongly turned off. Applying the negative potential TXL to the source of the N type transistor in the buffer 752, the potential of the body of the N type transistor in the buffer 752 is a negative potential TXL such as −2 V.

Thus, the maximum value of the gate potential difference of the N type transistor in the buffer 752 is higher than maximum values of the gate potential differences of the N type transistors in the buffers 754, 755, and 756. For example, the maximum value of the gate potential difference of the N type transistor in the buffer 752 is equal to 5 V. Thus, the N type transistor in the buffer 752 is the first kind transistor. The example has been described above in which the first kind transistor is included in the buffer 752 which outputs the signal TX to the transfer element 120. However, when the potential PXL is a negative potential, N type transistors included in the buffers 754, 755, and 756 may sometimes be the first kind transistor, like the buffer 752. Having described the example in which the potential GBN is equal to +3 V, another configuration may be considered in which the N type transistors in the buffers 754, 755, and 756 are the first kind transistors by setting the potential GBN equal to +5 V even though the potential PXL is equal to 0 V. However, because such a configuration may consume unnecessarily higher power, the buffers 754, 755, and 756 may be transistors excluding the first kind transistor.

Referring to FIG. 2, transistors included in the amplification circuit 300 include the second kind transistors. In more detail, in the amplification circuit 300, a plurality of (such as 5 to 15) transistors included in the operational amplifier 310 forming an inverting amplification circuit include the second kind transistors. For example, the second kind transistors in the operational amplifier 310 are included in a differential pair in an input stage of the operational amplifier 310. The transistor 320 configured to establish a short circuit between an input and an output of the operational amplifier 310 to reset capacitances 321 and 322 is also the second kind transistor. The transistors 323 and 324 configured to select the capacitance 321 and the capacitance 322 are also the second kind transistors. A CMOS switch 325 configured to establish a short circuit between an input and an output of the inverting amplification circuit is also the second kind transistor. A plurality of (such as 5 to 15) transistors included in the operational amplifier 330 forming a voltage follower also include the second kind transistors. For example, the second kind transistor may be included in a differential pair of an input stage of the operational amplifier 330. A CMOS switch 301 configured to control input to the amplification circuit 300 and a CMOS switch 302 configured to control output from the amplification circuit 300 are also the second kind transistors. A transistor included in the amplification circuit 300 or a transistor being a CMOS switch in FIG. 2 is also the second kind transistor. The amplification circuit 300 may include the third kind transistor and the fourth kind transistor. The operational amplifier 310 in this embodiment may perform both of an amplification operation and a CDS operation. However, the analog signal processing circuit 900 may have a CDS circuit and an amplification circuit separately.

According to this exemplary embodiment, the amplification circuit 300 provided for each column of the pixel circuits 100 may not include an insulated gate transistor having the maximum value of the gate potential difference higher than the second potential difference V2. Accordingly, the amplification circuit 300 may not include the first kind transistor. In other words, the maximum value of the gate potential difference of a transistor having the maximum one of the maximum values of gate potential differences among all insulated gate transistors included in the amplification circuit 300 is equal to or lower than the second potential difference V2. It should be noted that a transistor which may be provided for driving the amplification circuit 300 and is not provided for each column of the pixel circuits 100 may have the maximum value of the gate potential difference higher than the second potential difference V2 also if it is a transistor configuring a part of the amplification circuit 300. However, all transistors in the amplification circuit 300 even including a transistor configuring a part of the amplification circuit 300 may not have a maximum value of the gate potential difference higher than the second potential difference V2.

A level shift circuit may be provided for causing the potential to be applied to a gate of the second kind transistor to have an appropriate value, more specifically, a value equal to or lower than the second potential difference V2. Referring to FIG. 2, the capacitance 303 positioned between the pixel circuit 100 and the amplification circuit 300 configures the level shift circuit.

Referring to FIG. 2, partial transistors included in the AD converting circuit 400 are the second kind transistors, and the other partial transistors included in the AD converting circuit 400 are the third kind transistors. Transistors included in the horizontal output circuit 500 are the third kind transistors.

The AD converting circuit 400 provided for each column of the pixel circuits 100 includes a comparator 420 and a memory unit 460. The comparator 420 belongs to the analog unit 410 illustrated in FIG. 1, and the memory unit 460 belongs to the digital unit 450. The comparator 420 receives as input signals a reference signal and a pixel signal supplied from the reference signal generation unit 430. When the magnitude relationship between the inputs is inverted, the logic levels of the outputs of the comparator 420 are inverted. When the logic levels of the outputs of the comparator 420 are inverted, the memory unit 460 holds a count signal supplied from a counter unit (not illustrated). The count signal corresponds to a digitalized pixel signal. The count signal held in the memory unit 460 is transferred to the memory unit 550 in the horizontal output circuit via a switch (not illustrated). When the scanning unit 510 selects a memory unit 550 in a predetermined column, a digital pixel signal held in the memory unit 550 is output.

While the reference signal generation unit 430 is provided for each AD converting circuit 400 according to this embodiment, a plurality of AD converting circuits 400 may share one reference signal generation unit 430. While a plurality of AD converting circuits 400 share one counter unit according to this embodiment, a counter unit may be provided for each AD converting circuit 400.

The comparator 420 may include the second kind transistors. For example, the second kind transistor may be included in a differential pair in an input stage of the comparator 420. Transistors included in the reference signal generation unit 430, memory unit 460, memory unit 550 and scanning unit 510 are the third kind transistors.

According to this exemplary embodiment, the AD converting circuit 400 provided for each column of the pixel circuits 100 may not include an insulated gate transistor having a maximum value of the gate potential difference higher than the second potential difference V2. Accordingly, the AD converting circuit 400 may not include the first kind transistor. In other words, a maximum value of the gate potential difference of a transistor having the maximum one of the maximum values of gate potential differences among all insulated gate transistors included in the AD converting circuit 400 is equal to or lower than the second potential difference V2. It should be noted that a transistor which may be provided for driving the AD converting circuit 400 and is not provided for each column of the pixel circuits 100 may have the maximum value of the gate potential difference higher than the second potential difference V2 even if it is a transistor configuring a part of the AD converting circuit 400. However, all transistors in the AD converting circuit 400 even including a transistor configuring a part of the AD converting circuit 400 may not be have a maximum value of the gate potential difference higher than the second potential difference V2.

The digital signal processing circuit 600 illustrated in FIG. 1 is a CMOS logic circuit and is required to perform a high speed operation. The digital signal processing circuit 600 includes the third kind transistors. For example, the third kind transistor is included in the CMOS logic circuit. Thus, the digital signal processing circuit 600 may be driven with a lower gate potential difference compared with other transistors so that it may perform a high speed operation.

According to this exemplary embodiment, the digital signal processing circuit 600 may not include an insulated gate transistor having a maximum value of the gate potential difference higher than the third potential difference V3. Accordingly, the digital signal processing circuit 600 may not include the first kind transistor and the second kind transistor. In other words, a maximum value of the gate potential difference of a transistor having the maximum one of the maximum values of gate potential differences among all insulated gate transistors included in the digital signal processing circuit 600 is equal to or lower than the third potential difference V3.

Having described above the example that the amplification circuit 300 and the analog unit 410 in the AD converting circuit 400 include the second kind transistors, they may include the third kind transistors only without the second kind transistors. However, in order to provide a dynamic range of analog signals to be handled by the amplification circuit 300 and the AD converting circuit 400, the second kind transistors having a higher gate potential difference may be used instead of the third kind transistors.

The first kind transistors and the second kind transistors may be used in the digital signal processing circuit 600, but the third kind transistor may be used from viewpoint of high speed operations and reduction of power consumption.

Transistors included in the circuits may be divided into a plurality of types based on the structures of the transistors. In the block diagram in FIG. 1, different types of shading are used to indicate the types of transistor included in the circuits, including a first type transistor T1, a second type transistor T2, a third type transistor T3, and a fourth type transistor T4. For example, the first to fourth type transistors at least have different gate structures and source-drain structures the details of which will be described below. Transistors included in the circuits are all the same type according to this embodiment, but the circuits may include other types of transistor excluding the first to fourth type transistors.

Figure 4:
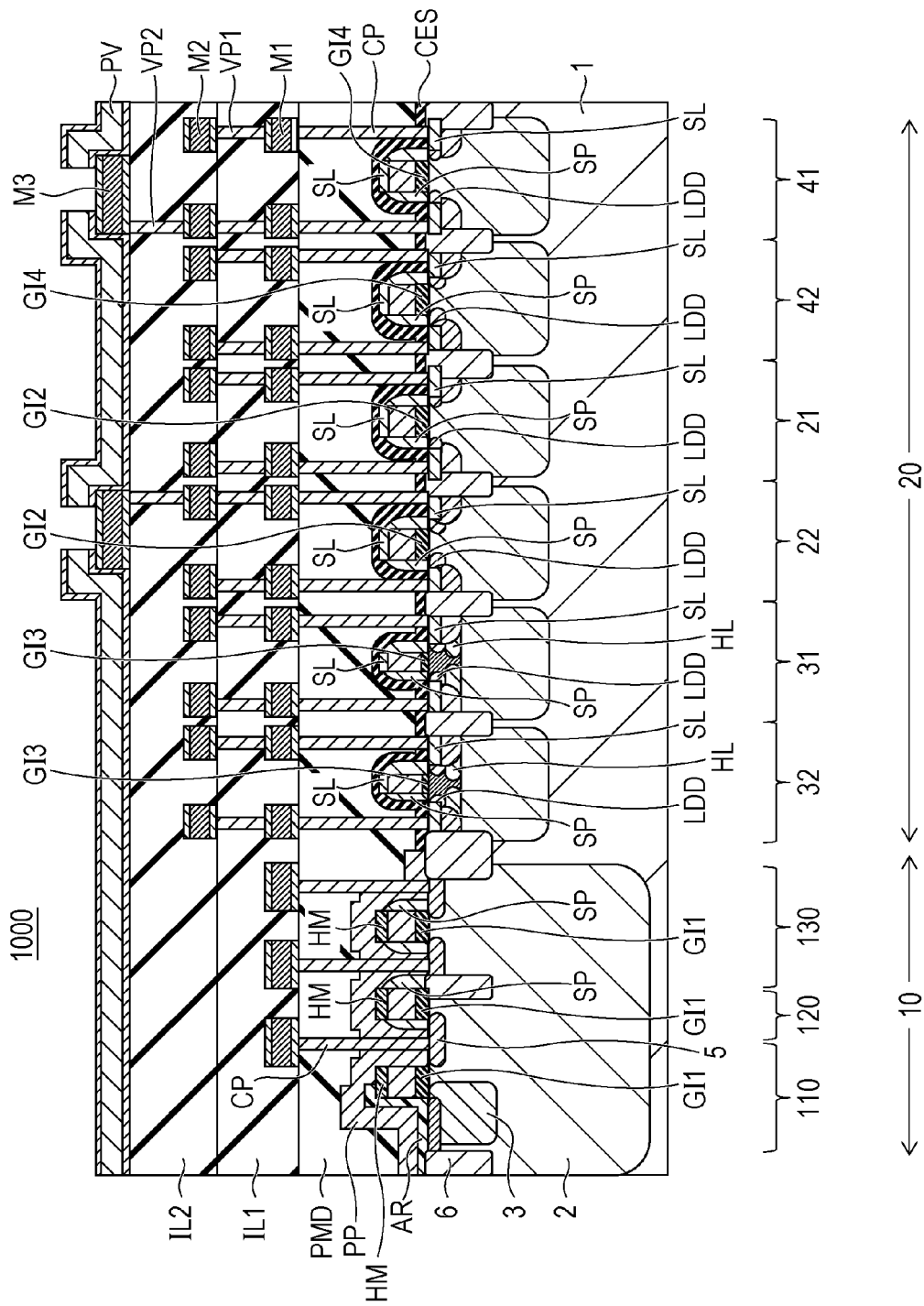
FIG. 4 is a schematic section diagram illustrating an example of an imaging apparatus.

FIG. 4 is a sectional view of the imaging apparatus 1000. FIG. 4 illustrates the photoelectric conversion element 110 and the transfer element 120, and amplification element 130 which are N type first type transistors. Although the reset element 140 is not shown, the reset element 140 may have the same structure as the amplification element 130. FIG. 4 further illustrates an N type second type transistor 21, a P type second type transistor 22, an N type third type transistor 31, a P type third type transistor 32, an N type fourth type transistor 41, and a P type fourth type transistor 42. The N type transistors may configure a CMOS circuit together with a complementary P type transistor, but an embodiment is not limited thereto.

The aforementioned kinds of transistors may be different type transistors. For example, the first kind transistor may be the first type transistor or the fourth type transistor. For example, the second kind transistor may be the second type transistor, and the third kind transistor may be the third type transistor. The fourth kind transistor may be one of the first to 4th type transistors. It should be noted that each of the circuits may include insulated gate transistors of a kind excluding the first to fourth kind transistors.

The photoelectric conversion element 110 has an N type accumulation region 3 arranged in a P type well region 2. A P type surface region 4 is provided between the accumulation region 3 and a surface of the semiconductor substrate 1. A floating diffusion region 5 is a drain of the transfer element 120 and configures at least a part of the node 125. The reset element 140 has a source that shares a diffusion region with a drain of the transfer element 120. An element isolation region 6 including an STI, a LOCOS, and a P type impurity region is provided between the amplification element 130 and the transfer element 120.

The amplification element 130 includes a side wall spacer SP in FIG. 4, but it is not necessary. A hard mask HM made of silicon oxide or silicon nitride is provided on gate electrodes of the transfer element 120 and amplification element 130. The photoelectric conversion element 110 is covered by an antireflection film AR. The antireflection film AR may have a structure having, for example, a 10-nm thick silicon oxide layer, a 50 nm-thick silicon nitride layer and a 110 nm-thick silicon oxide layer stacked in this order from the semiconductor substrate 1 side.

It is assumed that a gate insulating film GI1 of the first type transistor such as the transfer element 120 and amplification element 130 has a thickness TG1. It is assumed that a gate insulating film GI2 of the second type transistors 21 and 22 has a thickness TG2. It is assumed that a gate insulating film GI3 of the third type transistors 31 and 32 has a thickness TG3. It is assumed that a gate insulating film GI4 of the fourth type transistors 41 and 42 has a thickness TG4. According to this exemplary embodiment, the thickness TG3 may be smaller than the thickness TG2 (TG2>TG3). The thickness TG3 may be smaller than the thickness TG1 (TG1>TG3). A difference between the thickness TG1 and the thickness TG3 or a difference between the thickness TG2 and the thickness TG3 is preferably equal to or higher than 1.0 nm (10 angstroms) and is more preferably equal to or higher than 5.0 nm (50 angstroms).

The thickness TG1 may be equal to the thickness TG2 (TG1=TG2). The thickness TG1 may be different from the thickness TG2. However, in this case, the thickness TG2 may be smaller than the thickness TG1 (TG1>TG2). The difference between the thicknesses TG1 and TG2 may be lower than 1.0 nm. The thickness TG4 is also larger than the thickness TG3 (TG4>TG3), and the thickness TG4 may be equal to at least one of the thickness TG1 and thickness TG2.

At least one of the gate insulating films GI1, GI2, GI3, and GI4 may contain silicon oxide mainly but may contain nitrogen. Particularly, when a gate electrode of a certain transistor contains boron, a gate insulating film of the transistor may contain nitrogen to inhibit diffusion of boron to the semiconductor substrate 1. In the P type transistors 22, 32, and 42, boron may sometimes be implanted to polysilicon of the gate electrodes in an ion implantation process of boron for forming a diffusion region. Against this, the gate insulating films of the P type transistors 22, 32, and 42 may contain nitrogen. The peak concentration of nitrogen in the gate insulating films may be equal to or higher than 1%. On the other hand, the peak concentration may preferably be equal to or lower than 10% and may more preferably be equal to or lower than 5%. A relationship D1>D2A may be satisfied where D1 is a distance of a peak position of the nitrogen concentration in a gate insulating film from the semiconductor substrate 1 and D2 is a distance from the gate. In other words, nitrogen may be distributed on the gate side more than the semiconductor substrate side.

It is assumed that a gate length of the N type first type transistor such as the transfer element 120, and amplification element 130 are LG1. It is assumed that the gate length of the N type second type transistor 21 is LG2, the gate length of the N type third type transistor 31 is LG3, and the gate length of the N type fourth type transistor is LG4. The gate length LG2 may be smaller than the gate length LG1 (LG1>LG2). The gate length LG3 may be smaller than the gate length LG2 (LG2>LG3). The gate length LG4 may be larger than the gate length LG1 (LG4>LG1). The gate length LG4 may be larger than the gate length LG2 and gate length LG1 (LG4>LG2, LG3). In this manner, it may be configured such that the gate length of the first type transistor mainly used as the first kind transistor may be larger than the gate length of the second type transistor mainly used as the second kind transistor. Thus, the second potential difference V2 may be smaller than the first potential difference V1, which may provide better performance.

The impurity concentration of the sources and drains of the N type transistors 21, 31, and 41 is higher than that of the drain 5 of the N type transfer element 120 and the sources and drains of the amplification element 130. Each of the transistors 21, 22, 31, 32, 41, and 42 has a salicide structure. An upper surface of a gate electrode, a source and a drain of each of the transistors 21, 22, 31, 32, 41, and 42 having a salicide structure is covered by a silicide layer SL. On the other hand, the transfer element 120, and amplification element 130 in this embodiment does not have a salicide structure. The silicide layer SL may contain tungsten silicide, titanium silicide, cobalt silicide, nickel silicide or the like. An insulator film PP covering the pixel circuit unit 10 functions as a silicide block in a salicide process in which silicidation of transistors in the peripheral circuit unit 20 is performed.

Each of the transistors 21, 22, 31, 32, 41, and 42 has a side wall spacer SP having an Lightly Doped Drain (LDD) structure. The LDD structure has a semiconductor region LDD having an identical conductivity type of those of the source and drain and having a lower concentration than those of the source and drain. The region LDD is positioned below the side wall spacer SP. On the other hand, each of amplification element 130 has a side wall spacer SP but does not have an LDD structure.

Each of the transistors 31 and 32 has an Halo structure. The Halo structure has a semiconductor region HL having the opposite conductivity type of those of the source and drain and positioned below the source and drain. Providing the Halo structure may inhibit extension of a depletion layer and may reduce punch-through. On the other hand, the other transistors 120, 130, 21, 22, 41, and 42 do not have the Halo structure.

A multilayer wiring structure is formed on the semiconductor substrate 1. An interlayer insulating layer PMD, an interlayer insulating layer IL1, and an interlayer insulating layer IL2 are provided between a wiring layer M1, a wiring layer M2, and a wiring layer M3. The wiring layer M1 is connected to the semiconductor substrate 1 and the gate electrode through a contact plug CP, and the wiring layers M2 and M3 are connected to each other through via plugs VP1 and VP2. The multilayer wiring structure is covered by a passivation film PV including a silicon nitride layer. In the peripheral circuit unit 20, an insulator film CES covering the transistors 21, 22, 31, 32, 41, and 42 functions as an etching stopper usable when a contact hole for a contact plug CP is formed in the interlayer insulating layer PMD.

As described above, the transistors, particularly, the transfer element 120 in the pixel circuit 100 is the first kind transistor having a relatively higher gate potential difference. This may improve the transfer performance. An increased maximum value of the gate potential differences of the transistors in the pixel circuit 100 may increase the number of saturation electrons. Therefore, a good image may be acquired.

On the other hand, in the analog signal processing circuit 900 provided for each column, the second kind transistors having a lower maximum value of gate potential differences than the first kind transistors are used. As many as 100 to 10000 analog signal processing circuits 900 are aligned in accordance with the number of columns of the pixel circuits 100. The many analog signal processing circuits 900 are driven simultaneously to process analog signals in parallel. The analog signal processing circuits 900 operate for any selected row of the pixel circuits 100. In other words, the analog signal processing circuits 900 repeatedly operate the number of times corresponding to the number of rows of the pixel circuit units 10 in one frame period. Therefore, the power consumption of the analog signal processing circuit 900 provided for each column occupies a significantly large proportion of the whole power consumption of the imaging apparatus 1000. Use of the second kind transistors which may drive with a lower gate potential difference than the pixel circuits 100 for the analog signal processing circuits 900 may allow large reduction of the power consumption of the imaging apparatus 1000. Particularly, the power consumption at the switches may be significantly reduced.

Both of high image quality and low power consumption may be achieved in the manner described above. The reason why the second kind transistors which are driven with a lower gate potential difference than the pixel circuits 100 may be used for the analog signal processing circuits 900 will be described. Each of the analog signal processing circuit 900 may be driven enough with a transistor having a gate potential difference (second potential difference V2) equal to or lower than an output VOUT of the pixel circuit 100. The output VOUT of the amplification element 130 is lower than the potential VFD of the node 125 by the threshold voltage VTHA of the amplification element 130. Thus, the gate potential difference (second potential difference V2) for driving the analog signal processing circuit 900 may be lower than the gate potential difference (first potential difference V1) for driving the pixel circuit 100 by the threshold voltage VTHA of the amplification element 130.

A shorter gate length LG2 of the second kind transistors used in the analog signal processing circuit 900 than that of the first kind transistors may reduce the ON current of the second kind transistors. As a result, the power consumption in the analog signal processing circuit 900 may be reduced. Use of the third kind transistors having a lower the maximum value of the gate potential difference a lower thickness of the gate insulating films and a shorter gate length than those of the second kind transistors in the digital signal processing circuit 600 and the memory units may achieve high-performance digital signal processing. Use of the third kind transistors in the scanning units in the vertical driving circuit 700 and in the horizontal output circuit 500 may achieve high-speed scanning. The fourth kind transistors having a higher driving force because of its larger gate length are used in the output unit 750 in the vertical driving circuit 700 and the readout circuit 200. Thus, pixel signals from the pixel circuits 100 may be transmitted to the analog signal processing circuits 900 in the following stage at a high speed. Therefore, high-speed driving may be achieved.

The imaging apparatus 1000 according to this exemplary embodiment may be manufactured by using a semiconductor manufacturing technology used for manufacturing a CMOS image sensor.

EXAMPLE

An imaging apparatus was constructed by forming the transistors illustrated in FIG. 4 by forming a polysilicon electrode on a silicon substrate by using a well known CMOS process and implanting impurities into the silicon substrate. The second type transistors 21 and 22 were used as parts of the amplification circuit 300 and the AD converting circuit 400, and the third type transistors 31 and 32 were used in the horizontal output circuit 500, the digital signal processing circuit 600 and the scanning unit 710 in the vertical driving circuit 700. The fourth type transistors 41 and 42 were used in the readout circuit 200 and the output unit 750 in the vertical driving circuit 700.

The first type transistors were used in the transfer element 120, amplification element 130, reset element 140, selection element 150, and control element 160. Each of the first type transistors were defined to have TG1=11.5 nm and LG1=600 nm. It was defined such that the maximum value of the gate potential difference of the transfer element 120 was equal to 4.8 V, the maximum value of the gate potential difference of the amplification element 130 was equal to 4.5 V, and the maximum value of the gate potential difference of the reset element 140, selection element 150 and control element 160 was equal to 5.1 V. The first potential difference V1 was defined to be equal to 4.4 V such that those transistors may be the first kind transistors.

For the amplification element 130, $\Delta V=0.7$ V was set based on $\Phi_{MS}=-1.0$, $2\psi_B=0.9$, body impurity concentration $N_A=2.0\times10^{17}$ [cm$^{-3}$], and $C_O=3.0\times10^{-7}$ [F/cm$^2$].

The second potential difference V2 was defined to be 3.7 V, and the N type second type transistor 21 mainly designed for the second kind transistor was defined to have TG2=11.5 nm and LG2=550 nm. The second potential difference V2 was defined to be 3.7 V, and the P type second type transistor 22 mainly designed for the second kind transistor was defined to have TG2=11.5 nm, LG2=450 nm. The third potential difference V3 was defined to be 2.0 V, and the N type third type transistor 31 mainly designed for the third kind transistor was defined to have TG3=3.8 nm and LG3=200 nm. The third potential difference V3 was defined to be 2.0 V, and the P type third type transistor 32 mainly designed for the third kind transistor was defined to have TG3=3.8 nm and LG3=200 nm. The fourth potential difference V4 was defined to be 1.0 V, and the N type fourth type transistor 41 mainly designed for the fourth type transistor was defined to be TG4=11.5 nm and LG4=1020 nm. The fourth potential difference V4 was defined to be 1.0V, and the P type the fourth type transistor 42 mainly designed for the fourth type transistor was defined to have TG4=11.5 nm and LG4=670 nm.

The body potentials of the N type first to fourth type transistors were all defined to be 0 V except that the N type transistor in the buffer 252 was defined to be −1.4 V. Maximum values of the gate potential differences of the N type first type transistors were defined to be 4.8 V for the transfer element 120 and 4.5 V for the amplification element 130. Maximum values of the gate potential differences of the reset element 140, selection element 150 and control element 160 were defined to be 5.1 V. The maximum potential of the gate electrode of the N type second type transistor was defined to be 3.6 V. The maximum potential of the gate electrode of the N type third type transistor was defined to be 1.8 V.

Use of the imaging apparatus having this configuration provided high quality image with low power consumption.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2013-269673, filed Dec. 26, 2013, which is hereby incorporated by reference herein in its entirety.

What is claimed is:

1. An imaging apparatus having a pixel circuit unit and a peripheral circuit unit on a single semiconductor substrate comprising:
    a plurality of pixel circuits arranged, in the pixel circuit unit, in a matrix form, each of the plurality of pixel circuits including a photoelectric conversion element, a transfer element configured to transfer electric carriers generated in the photoelectric conversion element, and an amplification element configured to generate a signal based on the electric carriers generated in the photoelectric conversion element; and
    a plurality of analog signal processing circuits each provided, in the peripheral circuit unit, for each column of the pixel circuits, each of the plurality of analog signal processing circuits configured to process an analog signal output from the corresponding pixel circuit; and
    a digital signal processing unit provided in the peripheral circuit unit and configured to process a digital signal,
    wherein each of the plurality of pixel circuits includes a first kind transistor being an insulated gate field effect transistor and having a maximum value of a potential difference between a potential of its gate and a potential of its body equal to or higher than a first value,
    wherein each of the plurality of analog signal processing circuits includes a second kind transistor being an insulated gate field effect transistor and having a maximum value of a potential difference between a potential of its gate and a potential of its body equal to or lower than a second value that is lower than the first value,
    and each of the plurality of analog signal processing circuits does not include an insulated gate field effect transistor having a maximum value of a potential difference between a potential of its gate and a potential of its body higher than the second value,
    wherein the digital signal processing unit includes a third kind transistor being an insulated gate transistor and having a maximum value of a potential difference between a potential of its gate and a potential of its body equal to or lower than a third value that is lower than the second value,
    and the digital signal processing unit does not include an insulated gate field effect transistor having a maximum value of a potential difference between a potential of its gate and a potential of its body higher than the third value, and wherein the transfer element is the first kind transistor.

2. The imaging apparatus according to claim 1, wherein a difference $\Delta V$ between the first value and the second value satisfies an expression below:

$$\Delta V \geq \Phi_{MS} + \frac{2kT}{q}\ln\left(\frac{N_A}{n_i}\right) + \frac{2}{C_O}\sqrt{\varepsilon_S N_A kT \ln\left(\frac{N_A}{n_i}\right)}$$

where $\Phi_{MS}$ [V] is a work function difference between a gate electrode of the amplification element and a body of the amplification element, q [C] is an elementary charge, k [J/K] is a Boltzmann constant, T [K] is 300 [K], $n_i$ is an intrinsic carrier density of the body of the amplification element, $N_A$ [cm$^{-3}$] is an impurity concentration of the body of the amplification element, $C_O$ [F/cm$^2$] is a capacitance of a gate insulating film of the amplification element, and $\in_S$ [F/cm] is a dielectric constant of a body of the amplification element.

3. The imaging apparatus according to claim 1, wherein a thickness of the gate insulating film of the third kind transistor is smaller than a thickness of the gate insulating film of the first kind transistor and a thickness of the gate insulating film of the second kind transistor.

4. The imaging apparatus according to claim 1, wherein a gate length of the second kind transistor is smaller than a gate length of the first kind transistor.

5. The imaging apparatus according to claim 1, wherein the thickness of the gate insulating film of the first kind transistor is equal to the thickness of the gate insulating film of the second kind transistor.

6. The imaging apparatus according to claim 1, wherein the amplification element is the first kind transistor.

7. The imaging apparatus according to claim 1, wherein the transfer element is of a depression type, and the amplification element is of an enhancement type.

8. The imaging apparatus according to claim 1, wherein each of the plurality of pixel circuits includes a reset element configured to reset electric carriers generated by the photoelectric conversion element, and the reset element is the first kind transistor.

9. The imaging apparatus according to claim 1, wherein each of the plurality of pixel circuits includes a selection element configured to select an ON state or an OFF state of an output from the pixel circuit, and the selection element is the first kind transistor.

10. The imaging apparatus according to claim 1, wherein a capacitance configuring a level shift circuit is provided between the pixel circuit and the analog signal processing circuit.

11. The imaging apparatus according to claim 1, the analog signal processing circuit has at least one of an amplifier and a comparator having a differential pair in its input stage, and the differential pair includes the second kind transistor.

12. The imaging apparatus according to claim 1, wherein the analog signal processing circuit has a switch, and the switch is the second kind transistor.

13. The imaging apparatus according to claim 1, wherein each of a plurality of readout circuits is provided, in the peripheral circuit unit, correspondingly to a column of the pixel circuits;
    each of the plurality of readout circuits includes the fourth kind transistor which is an insulated gate field effect transistor configuring a current source; and
    the fourth kind transistor has a gate length larger than a gate length of the second kind transistor.

14. The imaging apparatus according to claim 13, wherein the fourth kind transistor has a gate length larger than a gate length of the first kind transistor.

15. The imaging apparatus according to claim 1, wherein
a plurality of driving circuits each provided, in the peripheral circuit unit, correspondingly to a row of the pixel circuits and each driving the corresponding pixel circuit;
each of the plurality of driving circuits includes an insulated gate field effect transistor having a maximum value of a potential difference between a potential of its gate and a potential of its body to be applied higher than the second value;
a signal based on an output of the field effect transistor of the driving circuit is applied to a gate of the first kind transistor in the corresponding pixel circuit.

16. The imaging apparatus according to claim 1, wherein the first kind transistor does not have an LDD structure;
the second kind transistor has an LDD structure;
the second kind transistor does not have a Halo structure; and
the third kind transistor has a Halo structure.

17. The imaging apparatus according to claim 1, wherein a difference between the first value and the second value is equal to or higher than 0.50 V.

18. The imaging apparatus according to claim 1, wherein the first value is equal to or higher than 4.0 V, and the second value is lower than 4.0 V.

19. The imaging apparatus according to claim 1, wherein each of the plurality of analog signal processing circuits includes an analog-digital conversion circuit, and the digital signal is output from the analog-digital conversion circuit.

20. An imaging system comprising:
the imaging apparatus according to claim 1; and
a signal processing device configured to process a signal output from the imaging apparatus.

* * * * *